United States Patent
Billsberry

(10) Patent No.: US 7,734,266 B2
(45) Date of Patent: Jun. 8, 2010

(54) ADAPTIVE RADIO FREQUENCY RECEIVER

(75) Inventor: Mark Andrew Billsberry, Indiatlantic, FL (US)

(73) Assignee: Powerwave Technologies, Inc., Santa Ana, CA (US)

( * ) Notice: Subject to any disclaimer, the term of this patent is extended or adjusted under 35 U.S.C. 154(b) by 651 days.

(21) Appl. No.: 11/707,475

(22) Filed: Feb. 15, 2007

(65) Prior Publication Data

US 2007/0197179 A1     Aug. 23, 2007

Related U.S. Application Data

(60) Provisional application No. 60/775,386, filed on Feb. 21, 2006.

(51) Int. Cl.
    H04B 1/16    (2006.01)
    H04B 1/10    (2006.01)
(52) U.S. Cl. ............... 455/232.1; 455/245.2; 455/226.3
(58) Field of Classification Search ............. 455/232.1, 455/233.1, 234.1, 234.2, 235.1, 239.1, 245.2, 455/250.1, 253.2
    See application file for complete search history.

(56) References Cited

U.S. PATENT DOCUMENTS

| | | | |
|---|---|---|---|
| 5,636,247 A | 6/1997 | Kamerman et al. | |
| 6,005,506 A | 12/1999 | Bazarjani et al. | |
| 6,134,430 A * | 10/2000 | Younis et al. | 455/340 |
| 6,175,551 B1 | 1/2001 | Awater et al. | |
| 6,668,164 B2 | 12/2003 | Hughes | |
| 6,950,641 B2 * | 9/2005 | Gu | 455/241.1 |
| 7,116,955 B2 * | 10/2006 | Schaffer et al. | 455/234.1 |
| 2004/0063413 A1 * | 4/2004 | Schaffer et al. | 455/234.1 |
| 2004/0156442 A1 | 8/2004 | Clausen | |
| 2004/0218689 A1 | 11/2004 | Akhtman | |
| 2004/0242177 A1 * | 12/2004 | Yang | 455/234.1 |

OTHER PUBLICATIONS

Dec. 19, 2007—PCT/US07/04566 International Search Report and Written Opinion of the International Searching Aughority.

* cited by examiner

*Primary Examiner*—Blane J Jackson
(74) *Attorney, Agent, or Firm*—David L. Henty

(57) ABSTRACT

An improved radio frequency receiver and method enabling the dynamic range of a radio frequency receiver to be extended are disclosed. In the receiver system, the effective received channel power is a combination of the wanted signal level, the noise floor and any in band spurious signals generated from blocking signals present at the input to the receiver system. When this total effective channel power is known, the front end gain is optimized by adaptively minimizing the total effective channel power. Since the wanted input signal power does not vary with the receiver gain setting, this optimizes the noise figure and input intercept point for the presented input signal conditions.

12 Claims, 2 Drawing Sheets

ADAPTIVE RADIO FREQUENCY RECEIVER

RELATED APPLICATION

This application claims the benefit under 35 U.S.C. 119 (e) of U.S. Provisional Patent Application Ser. No. 60/775,386, filed on Feb. 21, 2006, incorporated herein by reference in its entirety.

FIELD OF THE INVENTION

The present invention relates to radio frequency receivers, more particularly to super heterodyne receivers for cellular infrastructure applications.

BACKGROUND OF THE INVENTION

In a super-heterodyne receiver, signal frequencies are converted to a constant lower frequency (i.e., intermediate frequency) before detection. In the super-heterodyne receiver, a local oscillator (LO) signal in the receiver is mixed with incoming signals.

FIG. 1 shows the block diagram of a conventional super-heterodyne receiver 10. The receiver 10 includes a radio frequency (RF) amplifier 12, a first filter 14, a mixer 16, a first intermediate frequency (IF) amplifier 18, a surface acoustic wave (SAW) filter 20, a second IF amplifier 22, a variable gain function 24, a final IF amplifier 26, a second filter 28 and an analog to digital converter (ADC) 30.

In the receiver 10, the variable gain function 24 is placed after the SAW filter 20. As the power level at the input of the ADC 30 is increased, the gain is reduced, enabling a reduction in the dynamic range requirements of a final IF amplifier 26 and the ADC 30. Placing the variable gain function 24 after the SAW filter 20 has the advantage that the gain can be adjusted with respect to the input power of the ADC 30. The disadvantage, however, is that it does not reduce the dynamic range requirements of the mixer 16 or the first IF amplifier 18. Further, there is a limit to the dynamic range performance achievable with standard commercial mixer components.

If the variable gain function 24 is placed before the mixer 16, this would reduce the dynamic range requirements of the mixer 16 and the first IF amplifier 18. The difficulty with this approach is determining when to adjust the gain. Since an interfering signal may fall outside the pass-band of the SAW filter 28, the power of the ADC 30 can not be used to determine when the mixer 16 and the IF amplifiers would generate an unacceptable level of distortion.

BRIEF SUMMARY OF THE INVENTION

The present invention provides an improved radio frequency receiver and method, enabling the dynamic range of a radio frequency receiver to be extended. In one embodiment, an adaptive radio frequency receiver according to the present invention, comprises a variable gain circuit configured to generate a gain controlled signal from the input signal in response to control signals, a mixer configured to mix a local oscillator (LO) signal with the gain controlled signal and generate an intermediate frequency (IF) signal, an analog-to-digital-converter configured to generate a digital output signal based on the IF signal, and a controller configured to generate control signals based on the digital output signal, for controlling a gain of the variable gain circuit, to maintain desirable performance over a range of input signal levels.

Preferably, the controller generates control signals to adjust the gain of the variable gain circuit to obtain optimal receiver sensitivity, by adjusting the gain of the variable gain circuit based on minimizing the effective received total channel power for any given input signal condition. The effective received total channel power is a function of the power of said digital output and the gain of the receiver, and the controller is configured to determine the effective received total channel power at a nominal gain, at a slightly increased gain and at a slightly decreased gain, and then adjust the nominal gain to a gain corresponding to the lowest power, for optimal receiver sensitivity.

In another embodiment, an adaptive radio frequency receiver, comprising a first variable gain circuit configured to generate a first gain controlled signal from a radio frequency (RF) input signal in response to first control signals, a mixer configured to mix a local oscillator (LO) signal with the first gain controlled signal and generate an intermediate frequency (IF) signal, a second variable gain circuit configured to receive the IF signal and generate a second gain controlled signal in response to second control signals, an analog-to-digital-converter (ADC) configured to generate a digital output signal based on the second gain controlled signal, a controller configured to generate first and second control signals based on the digital output signal, for controlling a gain of the first and second variable gain circuits, to maintain desirable performance over a range of input signal levels.

Preferably, the controller generates first and second control signals to adjust the gain of the first and second variable gain circuits to obtain optimal receiver sensitivity, by: by generating first control signals for adjusting the gain of the variable gain circuit based on minimizing the effective received total channel power for any given input signal condition, and generating second control signals for an automatic level control loop which adjusts the second variable gain circuit based on a monitored power level calculated at the output of the ADC.

Further features and advantages of the present invention are set out in the following detailed disclosure.

DETAILED DESCRIPTION OF THE INVENTION

The present invention provides an improved radio frequency receiver and method, enabling the dynamic range of a radio frequency receiver to be extended. In the receiver, the effective received channel power is a combination of the wanted signal level, the noise floor and any in-band spurious signals generated from blocking signals present at the input to the receiver. When this total effective channel power is known, the front end gain is optimized by adaptively minimizing the total effective channel power. Since the wanted input signal power does not vary with the receiver gain setting, this optimizes the noise figure and input intercept point for the presented input signal conditions. As receiver requirements allow for desensitization in the presence of unwanted blocking signals, placing a variable gain function before a mixer in the receiver improves performance.

Figure 2:
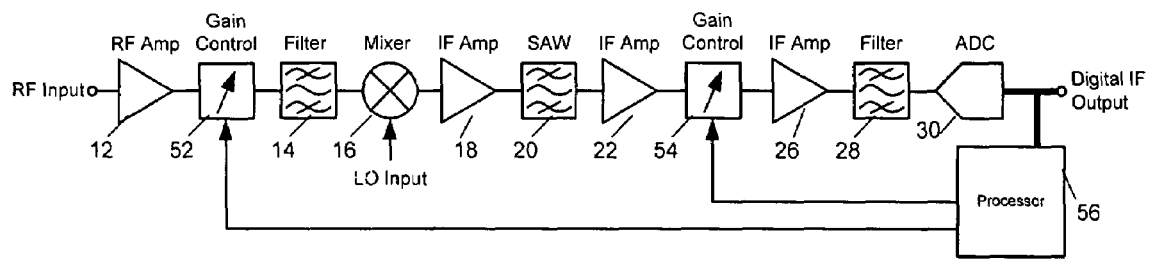
FIG. 2 is a block diagram of a super heterodyne receiver in accordance with the present invention.
Figure 3:
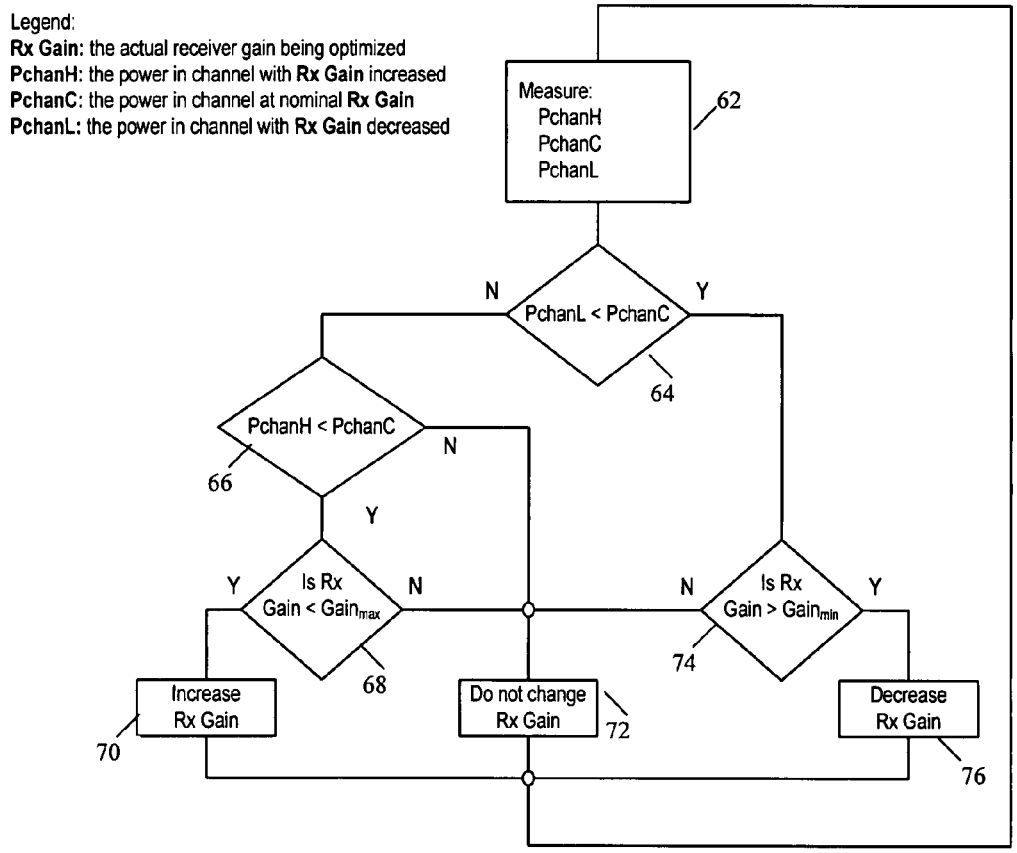
FIG. 3 is a flow diagram for the algorithm implemented by the processor employed in the receiver of FIG. 2.

Referring to FIGS. 2 and 3, a super heterodyne receiver according to an embodiment of the present invention is illustrated. As shown in FIG. 2, the super heterodyne receiver 50 includes a radio frequency (RF) amplifier 12, a first variable gain circuit 52, a first filter 14, a mixer 16 that generates a intermediate frequency (IF) signal, a first IF amplifier 18, a surface acoustic wave (SAW) filter 20, a second IF amplifier 22, a second variable gain circuit 54, a final IF amplifier 26, a second filter 28, an analog to digital converter (ADC) 30, and a processor 56 which controls at least the variable gain circuit 52, and may also control the variable gain circuit 54. The processor 56 comprises a controller which implements the process 60 shown in FIG. 3 for gain control to maintain desirable performance over a range of input signal levels. Preferably, the desirable performance is optimized performance.

The level of effective received total channel power can be calculated from the power of the digital output and the gain of the receiver. This effective received total channel power is a combination of all the power falling in the wanted receive channel including the wanted signal to be detected, the noise floor and the various spurious products from blocking signals at the input to the receiver.

Adjusting the gain control will vary the level of both the noise floor (since this will adjust the noise figure of the receiver system) and the in-band spurious products (since the input intercept point (I.I.P.) will be modified). Since the effective received total channel power is calculated in real time, it is possible to adapt/adjust the gain control based on minimizing the value of effective received total channel power for any given input signal condition. Gain is usually taken as the mean ratio of the signal output of a system to the signal input of the system.

There are many possible implementations for the algorithm that adapts the receiver gain in order to obtain optimal receiver sensitivity. The example process 60 in FIG. 3 shows one possible implementation. In the process 60, the effective received total channel power is calculated for the receiver 50 at nominal gain, slightly increased gain and slightly decreased gain. The process 60 then moves the nominal gain to that corresponding to the lowest power.

The process 60 includes the following steps for controlling the gain of the first variable gain circuit 52:

Step 62: Measure PchanH, PchanC and PchanL, wherein PchanH is the power in channel with the actual receiver gain being optimized (i.e., Rx Gain) increased by an increment, PchanC is the power in channel at nominal Rx Gain, and PchanL is the power in channel with Rx Gain decreased by a decrement.

Step 64: If PchanL<PchanC, then go to step 74, otherwise, go to step 66.

Step 66: If PchanH<PchanC, then go to step 68, otherwise, go to step 72.

Step 68: If Rx Gain<a maximum gain (i.e., Gainmax), then go to step 70, otherwise, go to step 72.

Step 70: Increase Rx Gain. Go to step 62.

Step 72: Do not change Rx Gain. Go to step 62.

Step 74: If Rx Gain>a minimum gain (i.e., Gainmin), then go to step 76, otherwise go to step 72.

Step 76: Decrease Rx Gain. Go to step 62.

In the receiver 50 of FIG. 2, the second variable gain circuit 54 can be controlled by the processor 56 using a conventional automatic level control loop which adjusts the second variable gain circuit 54 based on the monitored power level calculated at the output of the ADC 30. Inclusion of the second variable gain circuit 54 in the receiver 50 enables use of the gain of the second variable gain circuit 54 in order to calculate the power in each channel. As such, the receiver 50 implements an optimally adaptive receiver. The second variable gain circuit 54 can be removed from the receiver 50, resulting in a functioning and a less than optimally adaptive receiver.

In order to optimize the receiver gain by minimizing the detected channel power, it is desirable that the channel power is calculated accurately. Since the effective receive total channel power calculation requires the knowledge RF and IF gain, it is desirable that these are calibrated if necessary.

Figure 1:
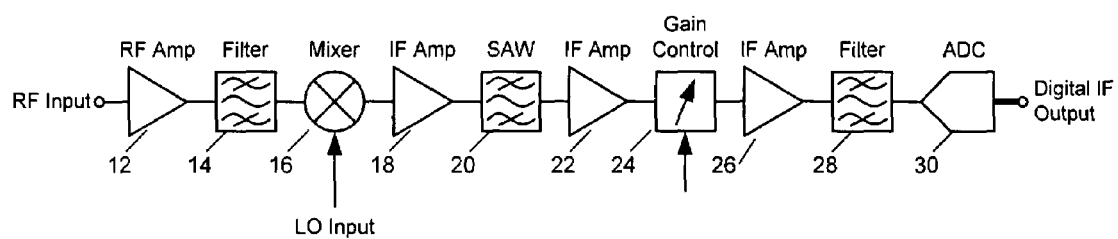
FIG. 1 is a block diagram of a typical super heterodyne receiver.

Table 1 below provides a comparison of the measured results for a conventional receiver as in FIG. 1 and an example receiver according to the present invention (FIG. 2) employing the process 60 in FIG. 3 for optimal adaptation, implemented on a common platform.

TABLE 1

Worst case performance over temperature and frequency

|  | Conventional | Optimal Adaptation |
|---|---|---|
| Noise Figure | 8 dB | 3 dB |
| Sensitivity (Small Signal) | −118 dBm | −123 dBm |
| Input Intercept Point | +9 dBm | +14 dBm |
| Sensitivity (2 × −23.1 dBm IMD Blockers) | −105 dBm | −112 dBm |

Further features and advantages of the invention will be apparent to those skilled in the art. Also, it will be appreciated by those skilled in the art that a variety of modifications of the illustrated implementation are possible while remaining within the scope of the invention.

What is claimed is:

1. An adaptive radio frequency receiver, comprising:
   a variable gain circuit configured to generate a gain controlled signal from a radio frequency (RF) input signal in response to control signals;
   a mixer configured to mix a local oscillator (LO) signal with the gain controlled signal and generate an intermediate frequency (IF) signal;
   an analog-to-digital-converter configured to generate a digital output signal based on the IF signal; and
   a controller configured to generate control signals based on the digital output signal, for controlling a gain of the variable gain circuit over a range of input signal levels;
   wherein the controller generates control signals to adjust the gain of the variable gain circuit based on minimizing the effective received total channel power;
   wherein the controller is configured to determine the effective received total channel power at a nominal gain, at a slightly increased gain and at a slightly decreased gain, and then adjust the nominal gain to a gain corresponding to the lowest power; and
   wherein the controller is further configured to:
      obtain a PchanH value representing the power in the channel with Rx Gain, increased by a increment, wherein Rx Gain represents the actual receiver gain being optimized;
      obtain a PchanC value representing the power in the channel at nominal Rx Gain;
      obtain a PchanL value representing the power in the channel with Rx Gain decreased by a decrement;
      if PchanL<PchanC, and Rx Gain>Gainmin, then generate control signals to decrease Rx Gain, Gainmin represents a minimum gain;
      if PchanL<PchanC, and Rx Gain≦Gainmin, then generate control signals to maintain Rx Gain;
      if PchanL≧PchanC, and PchanH≧PchanC, then generate control signals to maintain Rx Gain;

if PchanL≧PchanC, PchanH<PchanC and Rx Gain<Gainmax, then generate control signals to increase Rx Gain, wherein Gainmax represents a maximum gain; and if PchanL≧PchanC, PchanH<PchanC and Rx Gain≧Gainmax, then generate control signals to maintain Rx Gain.

2. The receiver of claim 1 wherein the controller generates control signals to adjust the gain of the variable gain circuit to obtain optimal receiver sensitivity.

3. The receiver of claim 1 wherein the effective received total channel power is a function of the power of said digital output and the gain of the receiver.

4. The receiver of claim 1 wherein the effective received total channel power is a function of all the power in a wanted receive channel including a wanted signal, a noise floor and various spurious products from blocking signals at the input to the receiver.

5. An adaptive radio frequency receiver, comprising:
a first variable gain circuit configured to generate a first gain controlled signal from a radio frequency (RF) input signal in response to first control signals;
a mixer configured to mix a local oscillator (LO) signal with the first gain controlled signal and generate an intermediate frequency (IF) signal;
a second variable gain circuit configured to receive the IF signal and generate a second gain controlled signal in response to second control signals;
an analog-to-digital-converter (ADC) configured to generate a digital output signal based on the second gain controlled signal; and
a controller configured to generate first and second control signals based on the digital output signal, for controlling a gain of the first and second variable gain circuits over a range of input signal levels;
wherein the controller generates first and second control signals to adjust the gain of the first and second variable am circuits to obtain optimal receiver sensitivity;
wherein the controller generates the second control signals for an automatic level control loop which adjusts the second variable gain circuit based on a monitored power; level calculated at the output of the ADC;
wherein the controller generates first control signals to adjust the gain of the first variable gain circuit based on minimizing the effective received total channel power;
wherein the effective received total channel power is a function of the power of said digital output and the gain of the receiver;
wherein the effective received total channel power is a function of all the power in a wanted receive channel including a wanted signal, a noise floor and various spurious products from blocking signals at the input to the receiver;
wherein the controller is configured to determine the effective received total channel power at a nominal gain, at a slightly increased gain and at a slightly decreased gain, and then adjust the nominal gain to a gain corresponding to the lowest power; and
wherein the controller is further configured to:
obtain a PchanH value representing the power in the channel with Rx Gain, increased by a increment, wherein Rx Gain represents the actual receiver gain being optimized;
obtain a PchanC value representing the power in the channel at nominal obtain a PchanL value representing the power in the channel with Rx Gain decreased by a decrement;

if PchanL<PchanC, and Rx Gain>Gainmin, then generate control signals to decrease Rx Gain, Gainmin represents a minimum gain;
if PchanL<PchanC, and Rx Gain≦Gainmin, then generate control signals to maintain Rx Gain;
if PchanL≧PchanC, and PchanH≧PchanC, then generate control signals to maintain Rx Gain;
if PchanL≧PchanC, PchanH<PchanC and Rx Gain<Gainmax, then generate control signals to increase Rx Gain, wherein Gainmax represents a maximum gain; and
if PchanL≧PchanC, PchanH<PchanC and Rx Gain≧Gainmax, then generate control signals to maintain Rx Gain.

6. The receiver of claim 5 wherein the controller generates the second control signals for an automatic level control loop which adjusts the second variable gain circuit based on a monitored power level calculated at the output of the ADC.

7. A method of adaptive processing of a radio frequency (RF) input signal, comprising the steps of:
utilizing a first variable gain circuit for receiving the input signal and generating a first gain controlled signal in response to control signals;
mixing the first gain controlled signal with a local oscillator (LO) signal to generate an intermediate frequency (IF) signal;
converting the IF signal into a digital output signal based on the IF signal; and
generating control signals based on the digital output signal, for controlling a gain of the first variable gain circuit over a range of input signal levels;
wherein the step of generating control signals includes generating control signals to adjust the gain of the first variable pain circuit based on minimizing the effective received total channel power,
wherein generating the control signals further includes determining the effective received total channel power at a nominal gain, at a slightly increased gain and at a slightly decreased gain, and then adjusting the nominal gain to a gain corresponding to the lowest power; and
wherein generating the control signals further includes:
obtaining a PchanH value representing the power in the channel with Rx Gain, increased by a increment, wherein Rx Gain represents the actual receiver gain being optimized;
obtaining a PchanC value representing the power in the channel at nominal Rx obtaining a PchanL value representing the power in the channel with Rx Gain decreased by a decrement;
if PchanL<PchanC, and Rx Gain>Gainmin, then generating control signals to decrease Rx Gain, Gainmin represents a minimum gain;
if PchanL<PchanC, and Rx Gain≦Gainmin, then generating control signals to maintain Rx Gain;
if PchanL≧PchanC, and PchanH≧PchanC, then generating control signals to maintain Rx Gain;
if PchanL≧PchanC, PchanH<PchanC and Rx Gain<Gainmax, then generating control signals to increase Rx Gain, wherein Gainmax represents a maximum gain; and
if PchanL≧PchanC, PchanH<PchanC and Rx Gain≧Gainmax, then generating control signals to maintain Rx Gain.

8. The method of claim 7 wherein the effective received total channel power is a function of the power of said digital output and the gain of the receiver.

9. The method of claim 7 wherein the effective received total channel power is a function of all the power in a wanted receive channel including a wanted signal, a noise floor and various spurious products from blocking signals at the input to the receiver.

10. The method of claim 7 further comprising the steps of:
utilizing a second variable gain circuit to receive the IF signal and generate a second gain controlled signal in response to control signals;
wherein the step of converting includes converting the second gain controlled signal into a digital output; and
wherein the step of generating control signals further includes generating first control signals for controlling a gain of the first variable gain circuit, and generating second control signals for controlling a gain of the second variable gain circuit.

11. The method of claim 10 wherein the step of generating control signals includes generating control signal to adjust the gain of the first and second variable gain circuits to obtain optimal receiver sensitivity.

12. The method of claim 11 wherein the step of generating control signals includes generating second control signals for an automatic level control loop which adjusts the second variable gain circuit based on a monitored power level calculated at the digital output.

* * * * *